US006630819B2

(12) United States Patent
Lanagan et al.

(10) Patent No.: US 6,630,819 B2
(45) Date of Patent: Oct. 7, 2003

(54) MAGNETO-OPTIC CURRENT SENSOR

(75) Inventors: Michael T. Lanagan, State College, PA (US); Vitalii K. Valsko-Vlasov, Downers Grove, IL (US); Brandon L. Fisher, Bolingbrook, IL (US); Ulrich Welp, Lisle, IL (US)

(73) Assignee: The University of Chicago, Chicago, IL (US)

( * ) Notice: Subject to any disclaimer, the term of this patent is extended or adjusted under 35 U.S.C. 154(b) by 296 days.

(21) Appl. No.: 09/790,961

(22) Filed: Feb. 22, 2001

(65) Prior Publication Data
US 2002/0145414 A1 Oct. 10, 2002

(51) Int. Cl.[7] ............................................. G01R 33/032
(52) U.S. Cl. ...................... 324/76.36; 324/537; 324/96; 324/76.11; 324/244.1
(58) Field of Search ........................ 324/76.11, 537, 324/96, 244.1, 244, 117 R, 76.36; 356/72, 73; 374/130

(56) References Cited

U.S. PATENT DOCUMENTS

| 3,980,949 A | | 9/1976 | Feldtkeller ................... 324/96 |
| 4,604,577 A | * | 8/1986 | Matsumura et al. ......... 324/244 |
| 4,612,500 A | | 9/1986 | Chen et al. ................... 324/96 |
| 4,613,811 A | | 9/1986 | Vaerewyck et al. .......... 324/96 |
| 4,683,421 A | * | 7/1987 | Miller et al. ................. 324/96 |
| 4,694,243 A | * | 9/1987 | Miller et al. ................. 324/96 |
| 4,947,107 A | * | 8/1990 | Doerfler et al. ............... 324/96 |
| 5,008,611 A | | 4/1991 | Ulmer, Jr. ..................... 324/96 |
| 5,140,156 A | * | 8/1992 | Imaeda et al. ............. 324/96 X |
| 5,399,853 A | * | 3/1995 | Maurice ..................... 324/96 X |
| 5,451,863 A | | 9/1995 | Freeman ....................... 324/96 |
| 5,691,837 A | * | 11/1997 | Itoh et al. ............. 324/244.1 X |
| 5,780,847 A | | 7/1998 | Dawson et al. ......... 250/227.17 |
| 5,834,933 A | | 11/1998 | Meier .......................... 324/117 |
| 5,963,026 A | * | 10/1999 | Bosselmann et al. ......... 324/96 |
| 6,141,093 A | * | 10/2000 | Argyle et al. ........... 324/537 X |
| 6,188,811 B1 | * | 2/2001 | Blake ........................... 385/12 |

OTHER PUBLICATIONS

Katsukawa, Hiroyuki et al. "Optical Current Transducer with Bulk . . . " Optical Review, Vol 4, No. 1A, 1997, pp 50–52.*
Blake, James "Fiber Optic Current Sensor Calibration" IEEE Transmission and Distribution Conf., 2001 , pp 1–4.*
Willsch, M. et al. "Magneto-optic Current Transducer for Applications in Power Industry" No date.*
Moore, Taylor, *Power*, EPRI Journal, Nov./Dec. 1997, pps. 31–36.

* cited by examiner

Primary Examiner—Edward Lefkowitz
Assistant Examiner—T. R. Sundaram
(74) Attorney, Agent, or Firm—Foley & Lardner

(57) ABSTRACT

An optical current transducer configured to sense current in the conductor is disclosed. The optical current transducer includes a light source and a polarizer that generates linearly polarized light received from a the light source. The light is communicated to a magneto-optic garnet that includes, among other elements, bismuth, iron and oxygen and is coupled to the conductor. The magneto-optic garnet is configured to rotate the polarization of the linearly polarized light received from the polarizer. The optical current transducer also includes an analyzer in optical communication with the magneto-optic garnet. The analyzer detects the rotation of the linearly polarized light caused by the magneto-optic garnet.

31 Claims, 4 Drawing Sheets

MAGNETO-OPTIC CURRENT SENSOR

SPONSORED RESEARCH OR DEVELOPMENT

The invention was made with U.S. Government support under contract no. W-31-109-ENG-38 awarded by the Department of Energy and the U.S. Government has certain rights in this invention.

FIELD OF THE INVENTION

The invention relates to current sensors which do not require a direct electrical circuitry connection to the conductor in the circuit whose current is being sensed. Particularly, the invention relates to current sensors of the type utilizing the Faraday effect. More particularly still, the invention relates to current sensors utilizing thin-film magneto-optic sensing elements.

BACKGROUND OF THE INVENTION

Current measuring devices and magnetometers have been developed, all based upon the Faraday effect. The Faraday effect causes the plane of polarization of a polarized beam of light passing through a transparent substance exhibiting the Faraday effect to rotate from the plane of polarization of the instant light by an amount proportional to the magnetic field passing through the substance parallel to the optical axis of the beam of light.

High-power electronics will be a multi-billion dollar market in the next decade encompassing industries as diverse as power utilities, automotive manufacturing, and navel ship construction. A crucial component in the emerging circuit designs for DC/AC inverters and DC/DC converters is the precise monitoring of high currents (typically up to the range of 300 amps to 500 amps). The current sensors to be used in these designs must fulfill several stringent requirements including, but not limited to: (a) operation over a wide frequency range (DC to 10 MHz) for the precise monitoring of pulse trains; (b) operation at elevated temperatures up to 150 degrees C. without the necessity of additional temperature sensors; (c) operation in the presence of large electromotive force (EMF) and mechanical vibrations; and (d) total electrical isolation in order to avoid any possibility of shorts between high power and control circuits. These requirements are difficult to satisfy with sensors that are based on traditional technology such as Hall effect, magneto resistance, pick-up coils, and shunt resistors. In particular, requirement (d) rules out any "electric" type sensor. Presently, at least one optical current sensor is commercially available, however, it requires wrapping long lengths of optical fiber around the current carrying conductor.

Accordingly, there is a need and desire for current sensors based on the Faraday effect. Also, there is a need and desire for sensors utilizing magneto-optic sensor material. Further still, there is a need and desire for magneto-optic current sensors that are able to operate over a wide frequency range. Yet further still, there is a need for magneto-optic sensors that are capable of operating at elevated temperatures. Yet further still, there is a need and desire for magneto-optic sensors that may operate in the presence of large EMF and mechanical vibrations. Yet further still, there is a need and desire for magneto-optic sensors that are electrically isolated from the circuit in which they are sensing current.

SUMMARY OF THE INVENTION

An exemplary embodiment of the invention relates to an optical current transducer configured to sense current in a conductor. The optical current transducer includes a light source and a polarizer configured to generate linearly polarized light received from the light source. The optical current transducer also includes a magneto-optic garnet comprising bismuth (Bi), iron (Fe), and oxygen (0). The magneto-optic garnet is configured to be coupled to the conductor and is in optical communication with the polarizer. The magneto-optic garnet is configured to rotate the polarization of the linearly polarized light received from the polarizer. Further, the optical current transducer includes an analyzer in optical communication with the magneto-optic garnet, the analyzer is configured to detect the rotation of the linearly polarized light caused by the magneto-optic garnet.

Another exemplary embodiment of the invention relates to a method of measuring current in a conductor. The method includes providing a light source and communicating light from the light source to a polarizer that is configured to generate linearly polarized light. The method also includes communicating the linearly polarized light from the polarizer to a magneto-optic garnet comprising bismuth (Bi), iron (Fe), and oxygen (O). The magneto-optic garnet is configured adjacent the conductor so that the magnetic field vector, caused by the conductor current, is perpendicular to the garnet file surface. The magneto-optic garnet is configured to rotate the polarization of the linearly polarized light received from a polarizer. Further, the method includes communicating the rotated light from the magneto-optic garnet to an analyzer in optical communication with the magneto-optic garnet. The analyzer is configured to detect the rotation of the linearly polarized light caused by the magneto-optic garnet.

Further, an exemplary embodiment of the invention relates to an optical current transducer configured to sense current in a conductor. The optical current transducer includes a light source and a sensor head. The sensor head includes a polarizer configured to generate linearly polarized light received from the light source. The sensor head also includes a magneto-optic garnet comprising bismuth (Bi), iron (Fe), and oxygen (O). The magneto-optic garnet is configured to be coupled to the conductor and is in optical communication with the polarizer. The magneto-optic garnet is configured to rotate the polarization of the linearly polarized light received from the polarizer. The sensor head further includes an analyzer in optical communication with the magneto-optic garnet. The analyzer is configured to detect the rotation of the linearly polarized light caused by the magneto-optic garnet.

Further still, an exemplary embodiment of the invention relates to a method of temperature compensation for a current sensor. The method includes providing a light source including more than one wavelength to a sensor head. The method also includes measuring the light intensity of more than one wavelength of light. Further, the method includes determining the temperature of the current sensor based on at least one ratio of light intensity of one wavelength of light to another wavelength of light. Further still, the method includes determining a Verdet Constant based on the temperature, determining light intensity based on the temperature and the Verdet Constant, and determining current detected by the current sensor based on the temperature and Verdet Constant.

Yet further still, an exemplary embodiment of the invention relates to a method of determining the temperature of a current sensor. The method includes providing a light source having a first wavelength and a second wavelength. The method also includes providing a current sensor head for receiving light from the light source. Further, the method includes detecting light intensity at the first wavelength and at the second wavelength from the current sensor head. Further still, the method includes determining temperature of the sensor head based on a ratio of light intensity of the first wavelength to light intensity of the second wavelength.

Yet further still, an exemplary embodiment relates to a method of determining sensor drift for a current sensor. The method includes providing a light source having a first wavelength, a second wavelength, and a third wavelength. The method also includes providing a current sensor head for receiving light from the light source. Further, the method includes detecting light intensity at the first wavelength, at the second wavelength, and at the third wavelength, the light coming from the sensor head. Further still, the method includes determining a first intensity ratio of the first intensity and third intensity and a second intensity ratio of the second intensity and the third intensity. Yet further still, the method includes determining sensor drift over time based on the first intensity ratio and the second intensity ratio.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION OF THE PREFERRED EMBODIMENTS

Figure 1:
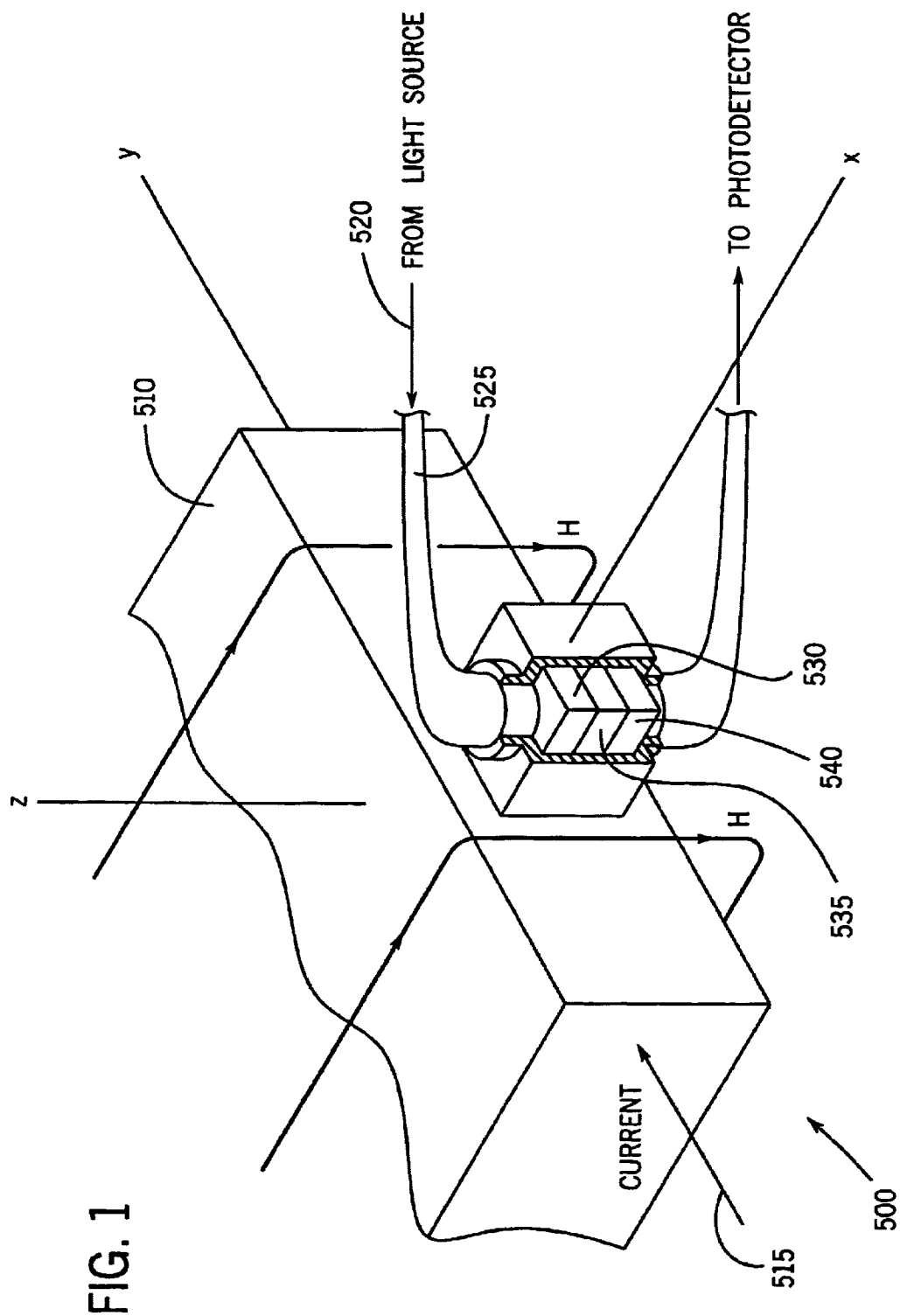
FIG. 1 is a representation of a magneto-optical sensor in communication with a bus-bar having current flowing therein.

Referring to FIG. 1, a sensor system 500 is depicted. Sensor system 500 is configured to measure current 515 flowing in a conductor, shown as bus-bar 510, by determining the magnetic field generated by current 515 flowing in bus-bar 510. The principle of operation of the sensor is based on the Faraday rotation of linearly polarized light. Light travels from a light source 520, through a fiber optic input cable 525, through a polarizer 530, and through a sensor material 535. Polarized light travels through sensor material 535 and exits through an analyzer, which, in an exemplary embodiment, is a crossed polarizer 540.

Figure 5:
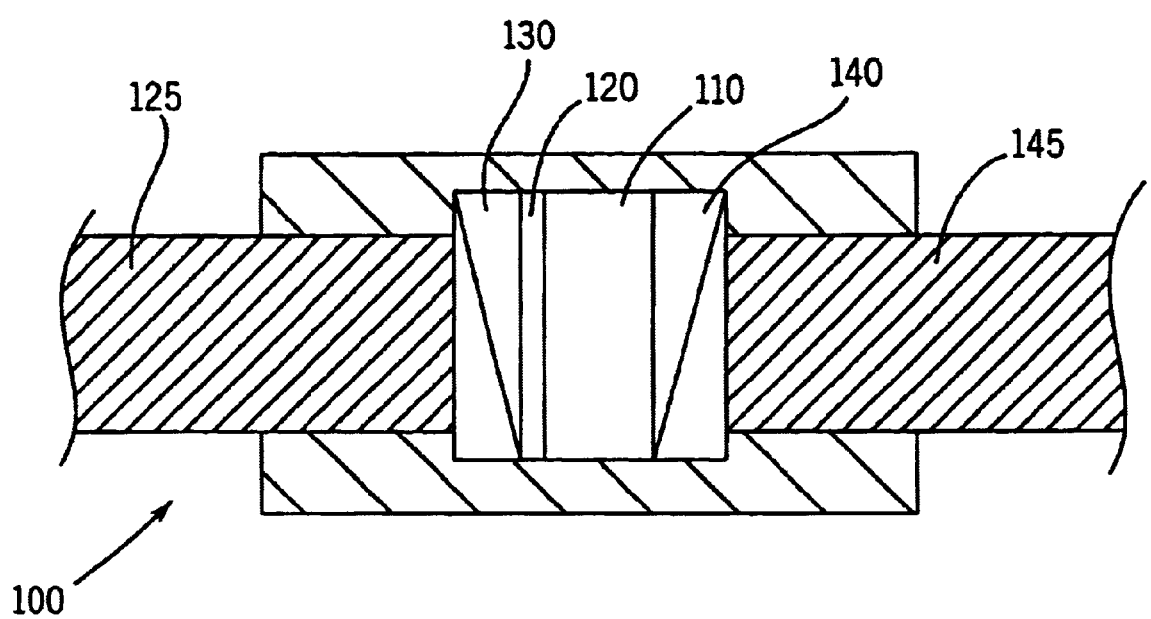
FIG. 5 is an exemplary diagram of components in a magneto-optical sensor head.

In an exemplary embodiment, the sensor material, as shown in FIG. 5 includes a gadolinium gallium garnet (GGG) substrate 110 having a thin film of sensor material 120, layered thereon. Similar to FIG. 1, as shown in FIG. 5, light enters through an input optical cable 125 which, in an exemplary embodiment, is a multi-mode optical fiber. The light travels through a polarizer 130, through a sensor material 120 and GGG substrate 110 to exit through an analyzer 140. Light exiting analyzer 140 proceeds through an output fiber optic cable 145. As light travels through sensor material 120, the plane of polarization rotates by an angle $\alpha = V(\lambda, T)Hd$, where d is the total sensor material thickness, H is the component of the magnetic field that is perpendicular to the plane of the magneto-optic garnet, and V is the Verdet factor (a function of wavelength $\lambda$ and temperature T) describing the strength of the Faraday effect of a specific material. For an yttrium-iron-garnet (YIG) based sensor material, V may be exceptionally large, thus allowing for a very compact and sensitive device. In one embodiment of the invention, the magneto-optic garnet includes the elements bismuth, iron, and oxygen in combination with yttrium or lutetium. In an exemplary embodiment, the magneto-optic garnet has a chemical composition that may be represented as $(Bi_xLu_{1-x})_3Fe_5O_{12}$.

In an exemplary embodiment (depicted in FIG. 1), the sensor is mounted so that the Z-component of the magnetic field, H, is maximized. Sensor 500 detects the magnetic field that is generated by current, I, 515 flowing through bus-bar 510: H=kI, The calibration constant k depends on the geometry of the bus-bar and the distance to the sensor and is typically determined independently at the outset. For typical applications magnetic fields of up to about 500 Gauss (G) are expected. Using polarizing and fiber-optical components, as shown in FIG. 1, the angle $\alpha$ and thus H and therefore the current are determined from the transmitted right intensity.

In an exemplary embodiment, the compact magneto-optical high-current sensor based on the magneto-optic sensing material, provides electric/optic isolation and may be used to sense currents from DC to 10 megahertz. Also, in an exemplary embodiment of the magneto-optic sensor for power electronics applications, the magneto-optic material is mounted in such a way that the Z-component (see FIG. 1) of the magnetic field generated by the current to be measured is maximized and may have the sensitivity of approximately 0.024 degrees per Gauss. Further, the saturation fields may be 300 G to 2,100 G. The integrated design of the sensor material and analyzer/polarizer, as depicted in sensor head 100 of FIG. 5, avoids the necessity of handling polarized light in long optical fibers.

Figure 2:
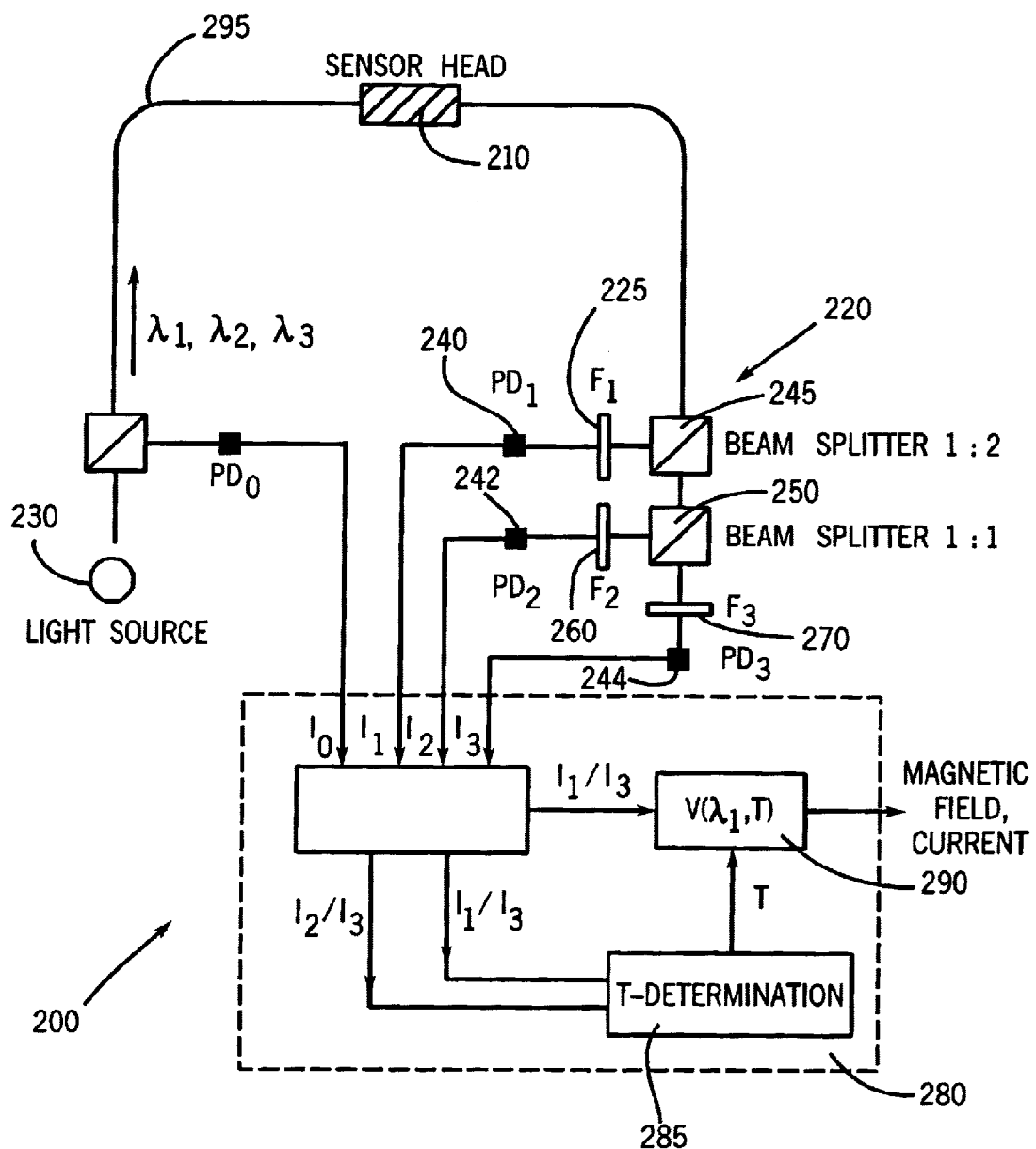
FIG. 2 is a block diagram of a magneto-optical sensor system.

Referring now to FIG. 2, a magneto-optical high-current sensor system 200 is shown. The system is configured to determine the current flowing in a conductor adjacent a sensor head 210. Sensor System 200 operates based on the Faraday rotation of linearly polarized light brought about by the magnetic field, H, generated by the current in the conductor. In an exemplary embodiment, DC currents, as well as alternating currents with frequencies up to 10 MHz, can be measured. As shown in FIG. 2, the sensor includes a sensor head 210 and fiber optic detection system 220. The sensor head is attached to a conductor and is comprised of a thin-film magneto-optic garnet sensor material, analyzer, and polarizer, as depicted in FIGS. 1 and 5. In an exemplary embodiment, a GRIN lens or system of GRIN lenses (or other types of lenses and other optical devices) may be included. The fiber optic detection system 200 of FIG. 2 includes two legs of multi-mode optical fiber. A light source 230 is capable of generating light with two (preferably 3 preprescribed wavelengths, $\lambda_1$, $\lambda_2$, and $\lambda_3$. A photo detector 240, beams splitters 245 and 250, filters 255, 260, and 270 and data analysis electronics 280, including a temperature determination subsystem 285 and a magnetic field and current calculator 290.

In operation, light source 230, which may be, in an exemplary embodiment, a white light such as a halogen lamp, or a combination of several LEDs, communicates light through a multi-mode optical fiber 295, transmitting the light to sensor head 210. At sensor head 210, the polarizer, as shown in FIGS. 1 and 5, generates linearly polarized light which traverses the active sensor material (magneto-optic material) and the optically inactive GGG substrate. In this step, the direction of polarization is rotated by an angle $$\alpha = V(\lambda,T)Hd, \quad (1)$$

where V is the temperature and wavelength dependent Verdet Constant, H is the component of the magnetic field that is perpendicular to the plane of the sensor, and d is the thickness of the active material. The change in polarization state is detected by the analyzer. The incorporation of GRIN lenses, in an exemplary embodiment, allows a more efficient coupling between the fibers and the sensor head. Transmitted light is carried by a second fiber to two beam splitters which generate three beams of equal intensity. Narrow band-pass filters F1 255, F2 260, and F3 270 centered on the wavelengths $\lambda_1$, $\lambda_2$, and $\lambda_3$, respectively, select the light intensity at the desired wavelength which is then measured with photo detectors PD$_1$ 240, PD$_2$ 242, and PD$_3$ 244. The intensity at wavelength $\lambda$ is provided by the expression $$I(\lambda,T,H) = I_0(\lambda)f(\lambda)[\sin^2(V(\lambda,T)Hd+\delta)+C(\lambda)]. \quad (2)$$

Here, Io ($\lambda$) is the incident intensity at wavelength $\lambda$., Io ($\lambda$) is determined by the characteristics of the light source. The quantity f($\lambda$) describes the reduction of the measured intensity due to losses in fiber optic cable 295, in the connectors, beam splitters 245, 250, etc., as well as due to absorption in the sensor material of sensor head 210. The quantity $\delta$ is the angle between the axis of polarizer and analyzer. In an exemplary embodiment, $$\delta = \frac{\pi}{4}$$

in order to achieve the best linearity of the response. The quantity C($\lambda$) accounts for offsets present even at totally crossed polarizer and analyzer $$\left(\delta = \frac{\pi}{2}\right).$$

These offsets which can arise from a residual ellipticity of the light imperfect polarizers, etc. are usually small as compared to the intensity measured at $$\delta = \frac{\pi}{4}.$$

This fact is expressed as:

$$C(\lambda) \ll \frac{1}{2}.$$

The quantities f($\lambda$), V($\lambda$,T), and C($\lambda$) constitute the calibration tables of the sensor. Typically, the Faraday angles that can be achieved are of the order of 10 degrees, however, the device is not limited to such angles. Under these conditions, the expression of equation (2) can be expanded with high accuracy to first order where $$\delta = \frac{\pi}{4}$$

yielding $$I(\lambda,T,H) = I_0(\lambda)f(\lambda)[(\tfrac{1}{2}+C(\lambda))+V(\lambda,T)Hd] \quad (3)$$

In an exemplary embodiment, the magneto-optical material is represented by the chemical formula $(Bi_xLu_{1-x})_3Fe_5O_{12}$ or $(Bi_xY_{1-x})_3Fe_5O_{12}$. These materials have Verdet constants of approximately 100 degrees per cmG which are among the highest known. This allows the construction of magneto-optical current sensors that utilize thin films as active elements and still have high sensitivity. As a consequence, small, compact sensors may be designed that do not require that the sensor encircles the current carrying conductor but that can be easily incorporated or retro-fitted into power-electronic circuits. The magneto-optic materials may be thin-films (grown epitaxially onto GGG substrates), with in-plane magnetic anisotropy, as the active material. In this case, the optical signal, that is the Faraday rotation, arises due to the rotation of magnetization of the garnet out of the film plane in response to the magnetic field generated by the current flowing in the conductor. This process does not involve domain wall motion and, therefore, displays only very little hysteresis. In addition, the field range of linear response can easily be adjusted to the desired application, typically several hundred of Gauss by changing the doping levels of the material.

The use of spectral features, that is the wavelength dependence of the Faraday rotation $\theta(\lambda)$, of $(Bi_xLu_{1-x})_3FeO_{12}$ and $(Bi_xY_{1-x})_3Fe_5O_{12}$ (but not necessarily limited to these materials) to achieve temperature compensation and checking of degradation of the sensor without the necessity of deploying additional mechanical or electro-magnetic means. Sensors, such as these designed for use in power-electronic applications must be reliable under high and varying operating temperatures.

Figure 3:
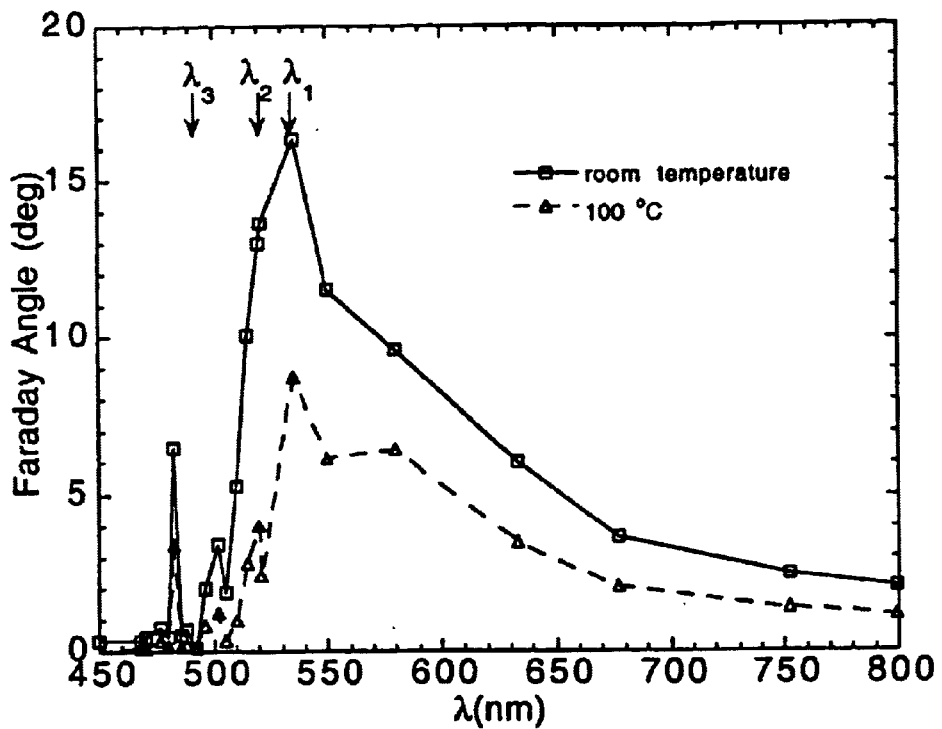
FIG. 3 is a graphical representation of Faraday angle relative to wavelength.
Figure 4:
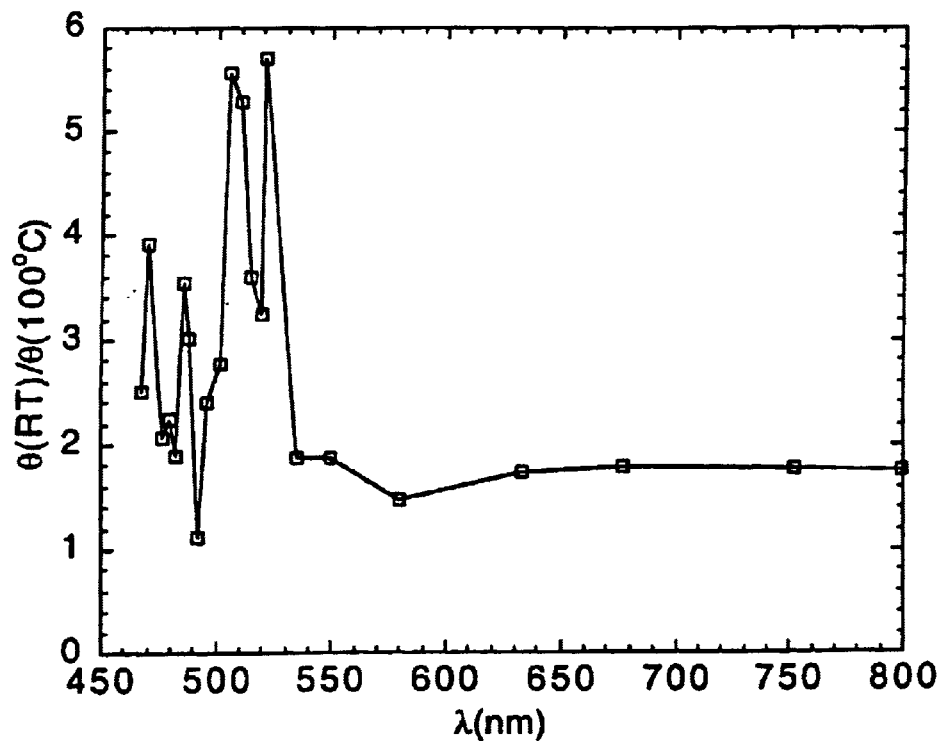
FIG. 4 is a graphical representation of relative angle with respect to wavelength.

Because the Verdet Constant and therefore the Faraday angle are temperature dependent, a change in the measured optical intensity can be caused either by a variation in temperature or in the magnetic field. The Faraday angle, $\theta(\lambda)$, measured at room temperature and at 100 degrees, is depicted in FIG. 3. At wavelengths above 530 nanometers (nm), the spectrum is featureless, at wavelengths below 530 nm, a complicated structure reflecting electronic transitions in the material is found. These two regimes display very different temperature dependencies shown in FIG. 4 as the ratio $\theta(\lambda,T=RT)/\theta(\lambda,T=100°\text{ C.})$. At long wavelengths, $\lambda > 530$ nm, the temperature dependence of the Faraday rotation is independent of wavelength. Therefore, measurements at different wavelengths in this part of the spectrum do not allow one to determined the temperature of the sensor, as noted before, However, at short wavelengths the temperature dependence is strongly wavelength dependent allowing the determination of the temperature as outlined below.

In an exemplary embodiment, three wavelengths, $\lambda 1$, $\lambda 2$ and $\lambda 3$ may be chosen according to the spectral features of the sensor material. At $\lambda 1 = 534$ nm (for example) the Faraday rotation is large but the temperature dependence is relatively small. At $\lambda 2 = 521$ nm (for example) the Faraday rotation is reduced, however, the temperature dependence is large, At the third wavelength, $\lambda 3 = 492$ nm (for example), the Faraday rotation is essentially zero, and equation (2) may be reduced to $$I(\lambda_3) = I_0(\lambda_3)f(\lambda_3)(\tfrac{1}{2}+C(\lambda_3)) \quad (4)$$

The normalized quantities $\lambda_{13} = I(\lambda 1,T,H)/I(\lambda_3)$ and $x_{23} = I(\lambda_2,T,H)/I(\lambda_3)$ that are provided by the read-out-electronics may be used to determine the temperature and current. These normalized quantities are independent of drifts in the incident light intensity caused, for example, by fluctuations in the power supply of the light source, and of drifts due to changes in the fiber optical setup. The quantity $V(\lambda_1,T)/V(\lambda_2,T)$ is magnetic field independent, but is temperature dependent. It can therefore be used to determine the temperature of the sensor head if expressed in terms of the normalized quantities $x_{13}$ and $x_{23}$ according to equation (5).

$$\frac{V(\lambda_1, T)}{V(\lambda_2, T)} = \frac{I_0(\lambda_2)}{I_0(\lambda_1)} \frac{f(\lambda_2)}{f(\lambda_1)} \frac{x_{13} - (I_0(\lambda_1)/I_0(\lambda_3))(f(\lambda_1)/f(\lambda_3))}{x_{23} - (I_0(\lambda_2)/I_0(\lambda_3))(f(\lambda_2)/f(\lambda_3))} \quad (5)$$

In equations (5) it has been assumed that the small correction $C(\lambda)$ is the same for all three wavelengths. Since the quantities Io and f appear in ratios the effects of drifts and fluctuations are eliminated. After the temperature has been determined with the help of equation (5) and of the calibration tables the magnetic field and thus the current in the bus-bar can be determined from the quantity $I(\lambda^1, T, H)/I(\lambda_3)$. Equation (4) predicts a temperature and field independent reading at wavelength $\lambda_3$ providing for an independent check for the proper operation of the sensor.

In an exemplary embodiment, the use of a sensor head incorporating the sensor material, and polarizer and analyzer may be used. The use of a sensor head incorporating all of the sensor material, and polarizer, and analyzer, alleviates the necessity of handling polarized light in long lengths of optical fiber and allows the use of multi-mode fibers required for transmitting light for different wavelengths.

Further, in an exemplary embodiment, a mounting procedure of the sensor head that maximizes the magnetic field component that is perpendicular to the sensor film and minimizes the effects of magnetic birefringence may be used. This is achieved by attaching the sensor head to the current conductor where the conductor cross section has the smallest overall radius of curvature in such a way that the film plane is parallel to the current direction (see FIG. 1) effects due to magnetic birefringence is minimized by assembling the sensor head in such a way that the light is polarized parallel to the crystallographic (100) direction of the sensor material.

While the detailed drawings, specific examples, and particular formulations given describe exemplary embodiments, they serve the purpose of illustration only. Materials and configurations shown and described may differ depending on the chosen performance characteristics and physical characteristics of the sensor and its application. For example, the type of substrate and/or the optical setup used may differ. The systems shown and described are not limited to the precise details and conditions disclosed. Furthermore, other substitutions, modifications, changes, and omissions may be made in the design, operating conditions, and arrangement of the exemplary embodiments without departing from the spirit of the invention as expressed in the appended claims.

What is claimed is:

1. An optical current transducer configured to sense current in a conductor, comprising:
   a single light source supplying light with at least a first, a second, and a third wavelength;
   a polarizer configured to generate linearly polarized light received from the light source; a sensor head, the sensor head including,
      a magneto-optic garnet comprising Bismuth (Bi), Iron (Fe), and Oxygen (O), configured to be coupled to the conductor and in optical communication with the polarizer, the magneto-optic garnet configured to rotate the polarization of the linearly polarized light received from the polarizer and
      an analyzer in optical communication with the magneto-optic garnet, the analyzer configured to detect the rotation of the linearly polarized light caused by the magneto-optic garnet; and
   a temperature compensation system configured to provide temperature compensation of the sensor head, based on light intensities of the first, the second, and the third wavelengths.

2. The optical current transducer of claim 1, wherein the magneto-optic garnet includes a gadolinium (Gd) gallium (Ga) garnet (GGG) substrate.

3. The optical current transducer of claim 1, wherein the magneto-optic garnet further comprises an element selected from the group consisting of Yttrium (Y) and Lutetium (Lu).

4. The optical current transducer of claim 1, wherein the magneto-optic garnet further comprises an element selected from the group consisting essentially of Yttrium (Y) and Lutetium (Lu), to provide a magneto-optic garnet having a Verdet Constant in the range of at least 80 deg/cmG.

5. The optical current transducer of claim 1, wherein the magneto-optic garnet further comprises a substrate.

6. The optical current transducer of claim 5, wherein the magneto-optic garnet is a thin-film disposed on the substrate.

7. The optical current transducer of claim 1, wherein the magneto-optic garnet has a chemical composition that may be represented as $(Bi_x Lu_{1-x})_3 Fe_5 O_{12}$.

8. The optical current transducer of claim 1, wherein the magneto-optic garnet has a chemical composition that may be represented as $(Bi_x Y_{1-x})_3 Fe_5 O_{12}$.

9. The optical current transducer of claim 1, further comprising a lens for communicating light between the magneto-optic garnet and the light source.

10. The optical current transducer of claim 1, further comprising an input optical cable transmitting light from the light source to the polarizer.

11. The optical current transducer of claim 10, further comprising an output optical cable transmitting light from the analyzer to at least one beam splitter.

12. The optical current transducer of claim 11, wherein the optical cable comprises multi-mode optical fiber.

13. The optical current transducer of claim 2, wherein the light source provides at least two distinct wavelengths of light.

14. The optical current transducer of claim 13, wherein the light source comprises at least two LEDs.

15. The optical current transducer of claim 13, wherein the light source comprises a halogen lamp.

16. The optical current transducer of claim 1, further comprising:
   at least one photodetector, receiving light from the analyzer.

17. The optical current transducer of claim 16, further comprising;
   a data collection apparatus, receiving an electrical signal from the at least one photodetector.

18. The optical current transducer of claim 1, wherein the magneto-optic garnet rotates the direction of polarization by an angle substantially represented by the relationship $\alpha = V(\lambda, T) H d$, where V is the temperature and wavelength dependent Verdet Constant, H is the component of a magnetic field generated by the current in the conductor that is perpendicular to the plane of the magneto-optic garnet, and d is the thickness of the active material.

19. A method of measuring current in a conductor, comprising:

providing a single light source supplying light with at least a first, a second, and a third wavelength;

communicating light from the light source to a polarizer configured to generate linearly polarized light;

communicating the linearly polarized light from the polarizer to a magneto-optic garnet comprising Bismuth (Bi), Iron (Fe), and Oxygen (O), the magneto-optic garnet configured adjacent the conductor so that the magnetic field vector, caused by the conductor current, is perpendicular to the garnet film surface, the magneto-optic garnet configured to rotate the polarization of the linearly polarized light received from the polarizer;

communicating the rotated light from the magneto-optic garnet to an analyzer in optical communication with the magneto-optic garnet, the analyzer configured to detect the rotation of the linearly polarized light caused by the magneto-optic garnet; and generating a temperature compensation factor for the magneto-optic garnet, based on light intensities of the first, and third second wavelengths.

20. The method of claim 19, further comprising;

providing light from the analyzer to a first beam splitter.

21. The method of claim 20, further comprising:

providing at least some of the light from the first beam splitter to a second beam splitter.

22. The method of claim 21, further comprising;

receiving, by a detector a first light component from the first beam splitter and a second light component from the second beam splitter.

23. An optical current transducer configured to sense current in a conductor, comprising:

a single light source supplying light with at least a first, a second, and a third wavelength;

a sensor head, the sensor head including,
  a polarizer configured to generate linearly polarized light received from the light source;
  a magneto-optic garnet comprising Bismuth (Bi), Iron (Fe), and Oxygen (O), configured to be coupled to the conductor and in optical communication with the polarizer, the magneto-optic garnet configured to rotate the polarization of the linearly polarized light received from the polarizer, and
  an analyzer in optical communication with the magneto-optic garnet, the analyzer configured to detect the rotation of the linearly polarized light caused by the magneto-optic garnet; and a temperature compensation circuit for detecting sensor head temperature based on light intensities of the first second, and third wavelengths.

24. The optical current transducer of claim 23, wherein the sensor head is attached to the conductor.

25. The optical current transducer of claim 24, wherein the sensor head is attached to the conductor at a location on the conductor where the cross section of the conductor has the substantially smallest overall radius of curvature.

26. The optical current transducer of claim 24, wherein the magneto-optic garnet is a thin-film having a film-plane and the film-plane is substantially oriented parallel to the direction of current flow through the conductor.

27. The optical current transducer of claim 24, wherein the magneto-optic garnet has a crystallographic direction and the polarizer polarizes light substantially parallel to the crystallographic direction.

28. A method of temperature compensation, for a current sensor, comprising:

providing a single light source including more than one wavelength to a sensor head;

measuring the light intensity of more than one wavelength of light;

determining the temperature of the current sensor based on at least one ratio of light intensity of one wavelength of light to another wavelength of light;

determining a Verdet Constant based on the temperature;

determining light intensity based on the temperature and the Verdet Constant; and determining the current detected by the current sensor based on the temperature and Verdet Constant.

29. A method of determining the temperature of a current sensor, comprising:

providing a single light source having a first wavelength and a second wavelength;

providing a current sensor head for receiving light from the light source;

detecting light intensity at the first wavelength and at the second wavelength from the current sensor head; and determining temperature of the sensor head based on a ratio of light intensity in the first wavelength to light intensity of the second wavelength.

30. A method of determining sensor drift for a current sensor, comprising:

providing a single light source having a first wavelength, a second wavelength, and a third wavelength;

providing a current sensor head for receiving light from the light source;

detecting light intensity at the first wavelength, at the second wavelength, and at the third wavelength, the light coming from the sensor head;

determining a first intensity ratio of the first intensity and the third intensity, and a second intensity ratio of the second intensity and the third intensity; and determining sensor drift over time based on the first intensity ratio and the second intensity ratio.

31. A method of determining sensor drift for a current sensor, comprising:

providing a single light source having a first wavelength, a second wavelength, and a third wavelength;

providing a current sensor head having a single active sensor material for receiving light from the light source;

detecting light intensity at the first wavelength, at the second wavelength, and at the third wavelength, the light coming from the sensor head;

determining a first intensity ratio of the first intensity and the third intensity, and a second intensity ratio of the second intensity and the third intensity; and determining sensor drift over time based on the first intensity ratio and the second intensity ratio.

* * * * *

UNITED STATES PATENT AND TRADEMARK OFFICE
CERTIFICATE OF CORRECTION

PATENT NO. : 6,630,819 B2
DATED : October 7, 2003
INVENTOR(S) : Michael T. Lanagan et al.

It is certified that error appears in the above-identified patent and that said Letters Patent is hereby corrected as shown below:

<u>Column 7,</u>
Lines 55-57, should read:

-- a sensor head, the sensor head including,
 a polarizer configured to generate linearly polarized light received from the light source; --
Line 63, please insert -- , -- after "polarizer."

<u>Column 9,</u>
Line 23, please replace "first, and third second wavelengths" with -- first, second, and third wavelengths --.
Line 51, please insert -- , -- after "first."

Signed and Sealed this

Eleventh Day of May, 2004

JON W. DUDAS
*Acting Director of the United States Patent and Trademark Office*